(12) United States Patent
Slaughter

(10) Patent No.: US 7,704,565 B2
(45) Date of Patent: Apr. 27, 2010

(54) METHOD OF MAKING A LAYERED COMPONENT WITH VECTOR DISCRIMINATION IN A VARIABLE DEPOSITION RATE PROCESS

(75) Inventor: Victor Blakemore Slaughter, Manchester, MO (US)

(73) Assignee: The Boeing Company, Chicago, IL (US)

( * ) Notice: Subject to any disclaimer, the term of this patent is extended or adjusted under 35 U.S.C. 154(b) by 696 days.

(21) Appl. No.: 11/603,598

(22) Filed: Nov. 22, 2006

(65) Prior Publication Data

US 2008/0118665 A1   May 22, 2008

(51) Int. Cl.
*C23C 14/04* (2006.01)

(52) U.S. Cl. .................. 427/596; 427/566; 427/561; 427/510; 427/98.8; 427/126.4; 427/126.5; 356/512; 700/97; 700/118; 355/67; 355/53

(58) Field of Classification Search .............. 427/596; 356/512; 355/67
See application file for complete search history.

(56) References Cited

U.S. PATENT DOCUMENTS

| 6,632,732 B2 * | 10/2003 | Williams ................ 438/597 |
| 7,148,898 B1 * | 12/2006 | Howard et al. ............ 345/581 |
| 2005/0068540 A1 * | 3/2005 | De Groot et al. ........... 356/512 |
| 2006/0132748 A1 * | 6/2006 | Fukuhara ................ 355/67 |

OTHER PUBLICATIONS

SHPA Technical Bulletin No. 1, Jan. 2000 pp. 1-15.*
Zhecheva A. et al. Surface & Coatings Technology vol. 200, (2005), pp. 2192-2207.*

* cited by examiner

*Primary Examiner*—Nadine Norton
*Assistant Examiner*—Maki Angadi

(57) ABSTRACT

A method of making a layered component with an improved surface finish by a shape metal deposition process is provided. The method comprises the steps of discriminating a first set of vectors on an exterior portion of the component from a second set of vectors on an interior portion of the component, and depositing a layer of metal material based on the vectors discriminated at different rates, wherein the material is deposited on the exterior portion at a high resolution and a slow rate, and the material is deposited on the interior portion at a low resolution and a fast rate.

20 Claims, 1 Drawing Sheet

METHOD OF MAKING A LAYERED COMPONENT WITH VECTOR DISCRIMINATION IN A VARIABLE DEPOSITION RATE PROCESS

BACKGROUND OF THE INVENTION

1) Field of the Invention

A method of making a layered component with vector discrimination in a variable deposition rate process is provided. More particularly, a method of making a layered component with an improved surface finish by a shape metal deposition process with vector discrimination and variable rate deposition is provided.

2) Description of Related Art

Known layer based manufacturing processes have revolutionized the process of prototyping complex geometric designs used for manufacturing component parts, such as parts used in aircraft. Layer based manufacturing processes, such as metal deposition processes, are fabrication techniques used by many aerospace, military, and industrial operations in order to modify metallic component parts for a variety of reasons that include restoring desired dimensions, improving abrasion resistance, improving temperature resistance, increasing corrosion protection, providing electrical shielding, and increasing conduction. Many known metal deposition processes exist. Purely metal deposition processes include shape metal deposition, Arcam process deposition, wire electron beam deposition, and laser additive manufacturing. However, known layer based manufacturing processes must sacrifice good component surface finish and good resolution if they are to increase deposition rates. If a good surface finish and resolution is desired, a very slow deposition rate is needed. A slow deposition rate requires longer fill times of the component parts, increases the overall cost of manufacturing, and makes it impractical to build certain component parts. On the other hand, a high deposition rate can produce large component parts, but they have low resolution and cannot be used without having to be finished. In order to finish the rough surface of the part, the surface has to be sandblasted or machined to get the surface to a usable finish. Accordingly, there is a need for an improved method of making a layered component with an improved surface finish by a shape metal deposition process that has both a high rate of deposition and a good surface finish and resolution that does not have the problems associated with known methods.

SUMMARY OF THE INVENTION

This need for an improved method of making a layered component with an improved surface finish by a shape metal deposition process that does not have the problems associated with known systems and that is unique, nonobvious, and advantageous system, is satisfied. None of the known methods provides all of the numerous advantages discussed herein. Unlike known methods, the method of making a layered component with an improved surface finish provides the following advantages: the method provides for the manufacture of a component part with an overall improved surface finish and high resolution and at a high rate of deposition; the method provides for an overall high rate of deposition with the elimination of or very minimal machining of the resulting component part; the method provides for the manufacture of a component part in an economically feasible amount of time and minimizes or reduces the time to produce the part compared to known methods; the method reduces the cycle time and cost for manufacturing component parts compared to known methods; and, the method may be used for any layer based manufacturing process or additive manufacturing process.

One embodiment of the invention provides for a method of making a layered component with an improved surface finish by a shape metal deposition process, the method comprising the steps of: discriminating a first set of vectors on an exterior portion of the component from a second set of vectors on an interior portion of the component; and, depositing a layer of metal material based on the vectors discriminated at different rates, wherein the material is deposited on the exterior portion at a high resolution and a slow rate, and the material is deposited on the interior portion at a low resolution and a fast rate.

Another embodiment of the invention provides for a method of making a layered component with an improved surface finish by a laser additive manufacturing deposition process, the method comprising the steps of: generating a stereolithography file from computer aided design data; slicing the stereolithography file into two-dimensional patterns; calculating a first set of vectors and a second set of vectors based on parameters of the sliced file; discriminating the first set of vectors on an exterior portion of the component from the second set of vectors on an interior portion of the component; depositing a layer of metal material based on the vectors discriminated at different rates, wherein the material is deposited on the exterior portion at a high resolution and a slow rate, and the material is deposited on the interior portion at a low resolution and a fast rate; and, repeating each of the discriminating and depositing steps for each of a plurality of additional metal layers.

BRIEF DESCRIPTION OF THE DRAWINGS

The foregoing and other advantages and features, and the manner in which the same are accomplished, will become more readily apparent upon consideration of the following detailed description taken in conjunction with the accompanying drawings which illustrate preferred and exemplary embodiments, but which are not necessarily drawn to scale, wherein.

DETAILED DESCRIPTION OF THE INVENTION

Figure 1:
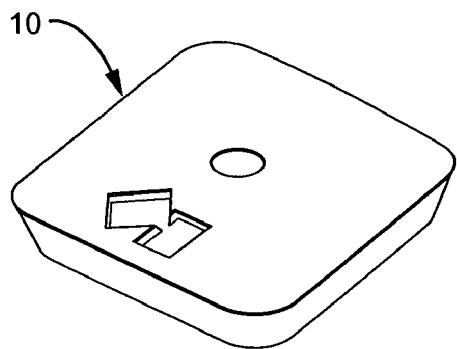
FIG. 1 is a perspective view showing a component part stereolithography file generated from computer aided design data.

Embodiments of the invention now will be described more fully hereinafter with reference to the accompanying drawings, in which some, but not all embodiments of the invention are shown. Indeed, several different embodiments may be provided and should not be construed as limited to the embodiments set forth herein. Rather, these embodiments are provided so that this disclosure will be thorough and complete and will fully convey the scope of the invention to those skilled in the art. Like numbers refer to like elements throughout.

The method provided is a method for producing layered components with overall good surface finish and reduced lead or production times more closely associated with lower resolution processes. The component parts produced from the method are preferably used in aircraft. One embodiment of the invention provides for a method of making a layered component with an improved surface finish by a shape metal deposition process. The method comprises the step of discriminating a first set of vectors on an exterior portion of the component from a second set of vectors on an interior portion of the component. Preferably, the step of discriminating the first set of vectors from the second set of vectors is conducted with a process control software, such as Magics RP obtained from Materialise of Belgium. Preferably, the first set of vectors comprise boundary or contour vectors around the exterior or perimeter of the component. Preferably, the second set of vectors comprise raster vectors or vectors in the interior or volume of the component. A vector is a physical quantity characterized by measurement of both magnitude and direction. A vector may be represented by an arrow whose length represents the magnitude and the direction represents the direction.

The method further comprises the step of depositing a layer of metal material based on the vectors discriminated at different rates, wherein the material is deposited on the exterior portion at a high resolution and a slow rate, and the material is deposited on the interior portion at a low resolution and a fast rate. Preferably, the rate of deposition of material on the interior portion is two or more times greater than the rate of deposition of material on the exterior portion. Preferably, the material deposited on the exterior portion uses a small melt pool and a wire to deposit the material at a high resolution and slow rate to achieve the improved surface finish of the component. Preferably, the small wire is a titanium gauge wire. Preferably, the material deposited on the interior portion uses a larger melt pool and a wire to deposit the material at a low resolution and a fast rate to achieve the improved surface finish of the component. Preferably, the large wire is a titanium gauge wire. Depositing of the metal material at both the slow deposition rate and the fast deposition rate preferably occurs simultaneously. Preferably, the metal material is a metal or metal alloy comprising titanium, aluminum, vanadium, cobalt, chromium, copper, nickel, or tungsten. However, other suitable metals or metal alloys may also be used. Preferably, the component manufactured as a result of the method of this embodiment has an improved surface finish and a surface roughness of between about 64 roughness height rating (rhr) to about 125 roughness height rating (rhr). The metal may be melted with an electron beam gun, arc welding technology, or another suitable electrical energy source. Preferably, the metal deposition machine used is one such as the Arcam machine obtained from Arcam AB of Sweden. However, other suitable metal deposition machines may also be used. The Arcam machine provides a free form fabrication technology for direct manufacturing of fully dense parts made of metal powder.

The method may further comprise the steps, prior to the discriminating step, of generating a stereolithography file from computer aided design data, slicing the stereolithography file into two-dimensional patterns, and calculating the first set of vectors and the second set of vectors based on parameters of the sliced file. The stereolithography (STL) file format is a standard data transmission format and is a format required to interact with stereolithography machines. This format approximates the surfaces of a solid model with triangles and lacks engineering data. The stereolithography format is designed to provide an adequate amount of data in the form of meshes to operate the stereolithography machines. Computer aided design (CAD) systems can produce stereolithography files. The computer aided design software takes the stereolithography file or other slice files and slices the three-dimensional component part to define two-dimensional sections of the component part. The component part may be sliced with a slicing component such as an electron beam gun, arc welding technology or another suitable electrical energy source. In order to create a solid component, raster fill patterns must be calculated based on material form, energy input, melt pool dynamics, geometry, and other parameters. It is preferred to use two sets of parameters, depending on what needs to be contoured or rastered. Different deposition rates need different parameters. There is one set of parameters for each vector set. The result is a set of vectors, which collectively "fill" in the component. The first set of vectors, or boundary vectors, are a set of vectors that are sent to the deposition machine being used to move the deposition tip from one point to another point or move the beam from one point to another point. Most layer based manufacturing technologies will process boundary vectors slightly differently than raster vectors. This difference is generally minimal, such as surface speed of the energy source or minimal changes in material deposition rates. Raster vectors will deposit more quickly than boundary vectors. The method discriminates or segregates between the boundary vectors and the raster vectors, that is, it discriminates vectors as belonging to either the exterior boundary of a component or to the interior of a component. Vectors calculated from the original vertices of the stereolithography file will belong to the boundary or exterior contours. These contours define the boundaries of the component for that cross-section. Vectors created to fill the interior of the component will belong to the raster or interior. For example, an outer contour could be a square shape and an inner contour could be a circle shape. Boundary contours are preferably deposited at a slow rate to obtain a good surface finish, and interior rasters are preferably deposited at a high rate. Thus, material deposited on the outer or exterior surface or boundary of the part is deposited at a high resolution and a slow rate to obtain a nice surface finish. The inner surface of the part is deposited at a low resolution and a high rate, that is, a lower resolution than the material deposited on outer surface, and a higher rate than the material deposited on the outer surface. The deposition equipment automatically switches from a slow rate to a higher rate when the interior or raster vectors are encountered. For example, if a component part that is desired is a square with a round hold in the middle, the first thing done is to make contours around the outside boundary to make the square outline. Then, the inside perimeter of the circle is made and the area between the outside square boundary and interior circle is filled in. The process software may have the capability to make multiple passes. It may go around the outside boundary and offset in one width of whatever material is being deposited, then it will do another pass, off-set, and repeat. The width of the step can vary. It is not always one path width. Then it will switch over at some point and finish the interior portion with a raster.

The method may further comprise the steps, after the depositing step, of repeating each of the discriminating and depositing steps for each of a plurality of additional metal layers. The steps are repeated depending on how many layers of the component are desired.

Figure 2:
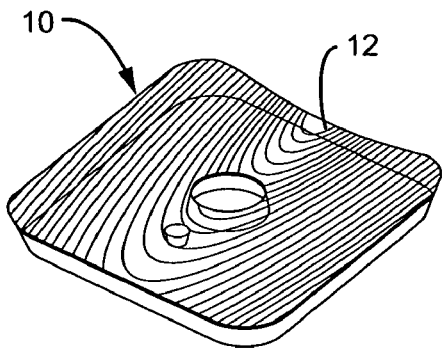
FIG. 2 is a perspective view showing the component part stereolithography file of FIG. 1 sliced into two-dimensional patterns.

Referring now to the drawings, FIG. 1 shows a perspective view showing a component part 10 stereolithography file generated from computer aided design data. FIG. 2 is a perspective view showing the component part 10 stereolithography file of FIG. 1 sliced into two-dimensional patterns 12.

Figure 3:
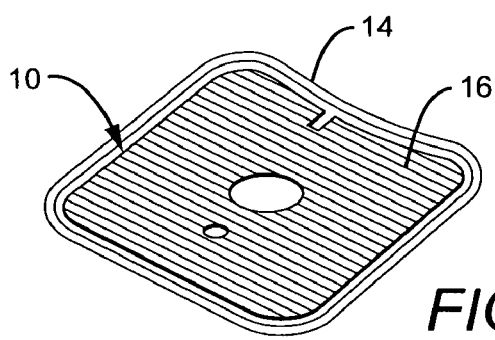
FIG. 3 is a perspective view showing the component part stereolithography file of FIG. 1 with generated contour vectors and raster vectors.
Figure 4:
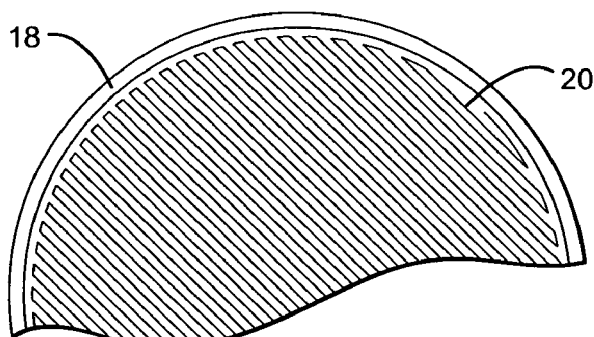
FIG. 4 is a front view of a portion of a component part showing the exterior contour vector portion and the interior raster vector portion; and, FIG. 5 is a front view of a portion of a component part showing deposited material on the component part.
Figure 5:
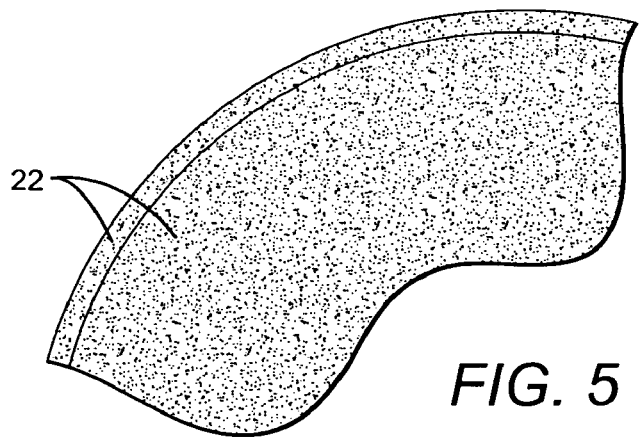

FIG. 3 is a perspective view showing the component part 10 stereolithography file of FIG. 1 with generated contour vectors 14 and raster vectors 16. FIG. 4 is a front view of a portion of a component part 10 showing an exterior contour vector portion 18 and an interior raster vector portion 20. FIG. 5 is a front view of a portion of a component part 10 showing deposited material 22 on the component part.

The shape metal deposition process may be a laser additive manufacturing process or laser consolidation process that uses a laser and powdered metal. The laser additive manufacturing process allows for the creation of equipment, which is capable of running variable deposition rates, such as shape metal deposition equipment. As an example, a laser additive manufacturing process may deposit the boundary of a component's cross-section utilizing a small high resolution melt pool to control material deposition. When the control system encounters the first interior vector, the deposition rate may be increased by a factor of two or more for the filling of the layer. The previously deposited boundary will provide a good working surface. The higher deposition rate of the interior will reduce deposition time. In a wire feed situation, one small gauge titanium feedstock wire may be used for boundaries, and a larger gauge titanium feedstock wire may be utilized for interior vectors. Other suitable melting or energy sources may include electron beam gun, arc welding, or another electrical energy source to melt the metal material onto the component part. Preferably, a robotic arm conducts the welding.

The laser additive manufacturing process or laser consolidation process is a laser based direct manufacturing material addition process that grows fully functional metal parts directly from computer aided design (CAD) files in a single step. The laser additive manufacturing process achieves superior part strength and material properties with both high performance alloys and conventional metals. Complex shapes are built directly to final dimensions with excellent accuracy and surface finish. The laser additive manufacturing process reduces cost, enables design freedom and delivers manufacturing productivity, and produces high quality parts directly from CAD. In addition, the laser additive manufacturing process reduces waste because it uses 99.5% of materials rather than machining away 90%. The laser additive manufacturing process forms complex structures layer by layer utilizing laser technology and powdered metal. Starting from a CAD model, the laser additive manufacturing process combines process control software with the material properties database to determine the optimum parameters for controlling the laser, powder feeder and motion system. Component parts made using the laser additive manufacturing process exhibit excellent part strength and material properties. Mechanical properties are generally better than cast and comparable to wrought material. Component parts produced using the laser additive manufacturing process exhibit net shape dimensional accuracy and surface finish.

In another embodiment, there is provides a method of making a layered component with an improved surface finish by a laser consolidation deposition process, the method comprising the steps of: generating a stereolithography file from computer aided design data; slicing the stereolithography file into two-dimensional patterns; calculating a first set of vectors and a second set of vectors based on parameters of the sliced file; discriminating the first set of vectors on an exterior portion of the component from the second set of vectors on an interior portion of the component; depositing a layer of metal material based on the vectors discriminated at different rates, wherein the material is deposited on the exterior portion at a high resolution and a slow rate, and the material is deposited on the interior portion at a low resolution and a fast rate; and, repeating each of the discriminating and depositing steps for each of a plurality of additional metal layers. Preferably, the material deposited on the exterior portion uses a small melt pool and a titanium gauge wire to deposit the material at a slow rate to achieve the improved surface finish of the component. Preferably, the material deposited on the interior portion uses a large melt pool and a titanium gauge wire to deposit the material at a fast rate to achieve the improved surface finish of the component. Preferably, the first set of vectors comprise boundary vectors and the second set of vectors comprise raster vectors.

In another embodiment, there is provided a method of making a layered component with an improved surface finish by a laser consolidation deposition process, the method comprising the steps of: discriminating a first set of vectors on an exterior portion of the component from a second set of vectors on an interior portion of the component; depositing a layer of metal material based on the vectors discriminated at different rates, wherein the material is deposited on the exterior portion at a high resolution and a slow rate, and the material is deposited on the interior portion at a low resolution and a fast rate; and, repeating each of the discriminating and depositing steps for each of a plurality of additional metal layers. The method may further comprise the steps, prior to the discriminating step, of generating a stereolithography file from computer aided design data, slicing the stereolithography file into two-dimensional patterns, and calculating the first set of vectors and the second set of vectors based on parameters of the sliced file.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed that modifications and other embodiments are intended to be included within the scope of the appended claims. Although specific terms are employed herein, they are used in a generic and descriptive sense only and not for purposes of limitation.

What is claimed is:

1. A method of making a layered component with an improved surface finish by a shape metal deposition process, the method comprising the steps of:

discriminating a first set of boundary vectors on an exterior portion of the component from a second set of raster vectors on an interior portion of the component; and, depositing a layer of metal material based on the boundary and raster vectors discriminated at different rates, wherein the material is deposited on the exterior portion at a high resolution and a slow rate, and the material is deposited on the interior portion at a low resolution and a fast rate such that the rate of deposition of the material on the interior portion is two or more times greater than the rate of deposition of the material on the exterior portion, and further wherein the layered component has a surface roughness of between about 64 roughness height rating (rhr) to about 125 roughness height rating (rhr).

2. The method of claim 1 further comprising the steps, prior to the discriminating step, of generating a stereolithography file from computer aided design data, slicing the stereolithography file into two-dimensional patterns, and calculating the first set of boundary vectors and the second set of raster vectors based on parameters of the sliced file.

3. The method of claim 1 comprising the further steps, after the depositing step, of repeating each of the discriminating and depositing steps for each of a plurality of additional metal layers.

4. The method of claim 1 wherein discriminating the first set of boundary vectors from the second set of raster vectors is conducted with a process control software.

5. The method of claim 1 wherein the material deposited on the exterior portion uses a small melt pool and a wire to deposit the material at a high resolution and slow rate to achieve the improved surface finish of the component.

6. The method of claim 5 wherein the wire is a titanium gauge wire.

7. The method of claim 1 wherein the material deposited on the interior portion uses a large melt pool and a wire to deposit the material at a low resolution and a fast rate to achieve the improved surface finish of the component.

8. The method of claim 7 wherein the wire is a titanium gauge wire.

9. The method of claim 1 wherein the metal material is selected from the group consisting essentially of titanium, aluminum, vanadium, cobalt, chromium, copper, nickel, and tungsten.

10. The method of claim 1 wherein the shape metal deposition process is a laser additive manufacturing deposition process that uses a laser and a powdered metal.

11. A method of making a layered component with an improved surface finish by a laser additive manufacturing deposition process, the method comprising the steps of:
   generating a stereolithography file from computer aided design data slicing the stereolithography file into two-dimensional patterns;
   calculating a first set of boundary vectors and a second set of raster vectors based on parameters of the sliced file;
   discriminating the first set of boundary vectors on an exterior portion of the component from the second set of raster vectors on an interior portion of the component;
   depositing a layer of metal material based on the boundary and raster vectors discriminated at different rates, wherein the material is deposited on the exterior portion at a high resolution and a slow rate, and the material is deposited on the interior portion at a low resolution and a fast rate such that the rate of deposition of the material on the interior portion is two or more times greater than the rate of deposition of the material on the exterior portion, and further wherein the layered component has a surface roughness of between about 64 roughness height rating (rhr) to about 125 roughness height rating (rhr); and,
   repeating each of the discriminating and depositing steps for each of a plurality of additional metal layers.

12. The method of claim 11 wherein the material deposited on the exterior portion uses a small melt pool and a titanium gauge wire to deposit the material at a high resolution and a slow rate to achieve the improved surface finish of the component.

13. The method of claim 11 wherein the material deposited on the interior portion uses a large melt pool and a titanium gauge wire to deposit the material at a low resolution and a fast rate to achieve the improved surface of the component.

14. The method of claim 11 wherein discriminating the first set of boundary vectors from the second set of raster vectors is conducted with a process control software.

15. A method of making a layered component with an improved surface finish by a laser additive manufacturing deposition process, the method comprising the steps of:
   discriminating a first set of boundary vectors on an exterior portion of the component from a second set of raster vectors on an interior portion of the component;
   depositing a layer of metal material based on the boundary and raster vectors discriminated at different rates, wherein the material is deposited on the exterior portion at a high resolution and a slow rate, and the material is deposited on the interior portion at a low resolution and a fast rate such that the rate of deposition of the material on the interior portion is two or more times greater than the rate of deposition of the material on the exterior portion, and further wherein the layered component has a surface roughness of between about 64 roughness height rating (rhr) to about 125 roughness height rating (rhr); and,
   repeating each of the discriminating and depositing steps for each of a plurality of additional metal layers.

16. The method of claim 15 further comprising the steps, prior to the discriminating step, of generating a stereolithography file from computer aided design data, slicing the stereolithography file into two-dimensional patterns, and calculating the first set of boundary vectors and the second set of raster vectors based on parameters of the sliced file.

17. The method of claim 15 wherein the material deposited on the exterior portion uses a small melt pool and a titanium gauge wire to deposit the material at a high resolution and a slow rate to achieve the improved surface finish of the component.

18. The method of claim 15 wherein the material deposited on the interior portion uses a large melt pool and a titanium gauge wire to deposit the material at a low resolution and a fast rate to achieve the improved surface of the component.

19. The method of claim 15 wherein discriminating the first set of boundary vectors from the second set of raster vectors is conducted with a process control software.

20. The method of claim 15 wherein the metal material is selected from the group consisting essentially of titanium, aluminum, vanadium, cobalt, chromium, copper, nickel, and tungsten.

* * * * *